(12) United States Patent
Kim

(10) Patent No.: US 6,462,994 B2
(45) Date of Patent: Oct. 8, 2002

(54) SEMICONDUCTOR MEMORY DEVICE WITH REDUNDANCY LOGIC CELL AND REPAIR METHOD

(75) Inventor: Jae Hoon Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/929,930

(22) Filed: Aug. 15, 2001

(65) Prior Publication Data

US 2002/0044489 A1 Apr. 18, 2002

(30) Foreign Application Priority Data

Oct. 16, 2000 (KR) .......................................... 2000-60763

(51) Int. Cl.[7] ................................................. G11C 7/00
(52) U.S. Cl. ....................................... 365/200; 365/201
(58) Field of Search .............................. 365/200, 201, 365/189.01, 189.05, 189.07, 230.06, 230.08

(56) References Cited

U.S. PATENT DOCUMENTS 6,097,644 A * 8/2000 Shirley ........................ 365/200

* cited by examiner

Primary Examiner—David Lam
(74) Attorney, Agent, or Firm—F. Chau & Associates, LLP.

(57) ABSTRACT

A semiconductor memory device includes an address buffer for receiving an external address. A row decoder and a column decoder respectively decode a row address and a column address, and respectively generate a word line selecting signal and a bit line selecting signal. A memory cell array has cells. Each cell is activated by a selection of a word line and,a bit line. A redundancy logic cell replaces defect cells in the memory cell array. Latches store defect cell addresses corresponding to the defect cells in the memory cell array. Comparators output repair signals when an address stored in the latches corresponds to the external address. A redundancy controller generates a control signal to intercept signals corresponding to the defect cells in response to a repair signal, and generates another control signal to enable a read/write operation of the redundancy logic cell in place of the defect cells.

18 Claims, 6 Drawing Sheets

SEMICONDUCTOR MEMORY DEVICE WITH REDUNDANCY LOGIC CELL AND REPAIR METHOD

BACKGROUND OF THE INVENTION

1. Technical Field

The present invention relates generally to semiconductor memory devices and, in particular, to a semiconductor memory device and a repair method that employ programmable self-contained repairable cells to repair defect cells of a semiconductor memory device in a package state.

2. Background Description

In a semiconductor memory device such as a dynamic random access memory (DRAM) device, a memory cell plays an important role. Therefore, when a single cell in a group of cells has a defect, which-results in a malfunction of the-entire group of cells, the corresponding memory device is considered to be "condemned goods". The greater the degree of integration of a DRAM, the greater the probability that some of the cells contained therein will have defects. However, the disposal of such devices as defective goods is an inefficient way to reduce mass product yields.

Accordingly, pre-constructing redundancy cells in DRAMs is a common way to obtain an acceptable device when that device is defective. In such a case, defect cells are replaced with redundancy cells when the defect cells are detected.

Redundancy cell repair technology fabricates sufficient fuses in a semiconductor memory device, and replaces any defect column lines and row lines with spare lines by applying a laser beam method. However, the laser beam method is mainly employed in a wafer state that precedes the packaging of a semiconductor device. Therefore, the repair process cannot be performed when defect cells are found after the device has been packaged. U.S. Pat. Nos. 6,011,734 and 5,764,577 disclose repair technology that is implemented in the packaging step of a semiconductor device.

U.S. Pat. Nos. 6,011,734 and 5,764,577 disclose repair methods that pre-construct spare cells in a DRAM device, store a defect cell address to a latch, inactivate a corresponding defect cell by comparing the latched address with the address accessed from the outside, and then activate redundancy circuits.

However, the above-mentioned U.S. Patents disclose redundancy cells established in the same physical structures as those of a memory cell array, and developed by the same processes as those of the memory cell array. Therefore, redundancy memory cells exhibit a high probability of having the same defect cells as those of memory cells. As a result, the repair processes for such devices are difficult in the case that defect redundancy cells are found.

SUMMARY OF THE INVENTION

The problems stated above, as well as other related problems of the prior art, are solved by the present invention, a semiconductor memory device and a repair method that employ programmable self-contained repairable cells to repair defect cells of a semiconductor memory device in a package state. The semiconductor memory device and the repair method of the invention pre-construct redundancy logic cells in the peripheries of a memory cell array to replace defect cells of the memory cell array with the redundancy logic cells.

According to an aspect of the present invention, there is provided a semiconductor memory device. The device includes an address buffer for receiving an external address. A row decoder decodes a row address provided by the address buffer, and generates a word line selecting signal. A column decoder decodes a column address provided by the address buffer, and generates a bit line selecting signal. A memory cell array has a plurality of memory cells. Each of the plurality of memory cells is activated by a selection of a word line and a bit line by the word line selecting signal and the bit line selecting signal, respectively. A redundancy logic cell replaces defect cells in the memory cell array. A plurality of defect cell address latches store defect cell addresses corresponding to the defect cells in the memory cell array. The defect cells are detected in a memory test. A plurality of comparators output repair signals when an address stored in the plurality of defect cell address latches corresponds to the external address received by the address buffer. A redundancy controller generates a control signal to intercept the word line selecting signal and the bit line selecting signal corresponding to the defect cells in response to a repair signal outputted in a normal mode, and generates another control signal to enable a read/write operation of the redundancy logic cell in place of the defect cells.

According to another aspect of the present invention, there is provided a semiconductor memory device. The device includes a row address buffer for receiving an external row address signal. A column address buffer receives an external column address signal. A row decoder decodes a row address provided by the row address buffer, and generates a word line selecting signal. A column decoder decodes a column address provided by the column address buffer, and generates a bit line selecting signal. A memory cell array has a plurality of memory cells. Each of the plurality of memory cells is activated by a selection of a word line and a bit line by the word line selecting signal and the bit line selecting signal respectively. A redundancy logic cell replaces defect cells in the memory cell array. A plurality of defect cell row address latches store defect cell row addresses corresponding to the defect cells in the memory cell array. The defect cells are detected in a memory test. A plurality of defect cell column address latches store defect cell column addresses corresponding to the defect cells in the memory cell array. The defect cells are detected in the memory test. A plurality of first comparators output row repair signals when a defect cell row address stored in one of the plurality of defect cell row address latches corresponds to the row address provided by the row address buffer in a normal mode. A plurality of second comparators output column repair signals when a defect cell column address stored in one of the plurality of defect cell column address latches corresponds to the column address provided by the column address buffer in the normal mode. A redundancy controller generates a control signal to intercept the word line selecting signal and the bit line selecting signal corresponding to the defect cells in response to a row and a column repair signal, and generates another control signal to enable a read/write operation of the redundancy logic cell in place of the defect cells.

According to yet another aspect of the present invention, there is provided a semiconductor memory device. The device includes an address buffer for receiving an external address. A row decoder decodes a row address provided by the address buffer, and generates a word line selecting signal. A column decoder decodes a column address provided. by the address buffer, and generates a bit line selecting signal. A memory cell array has a plurality of memory cells. Each of the plurality of memory cells is activated by a selection of a word line and a bit line by the word line selecting signal and the bit line selecting signal respectively. A redundancy logic cell replaces defect cells in the memory cell array. A plurality of defect cell address storage devices store defect cell addresses corresponding to the defect cells in the memory cell array. The defect cells are detected in a test mode. A plurality of comparison devices output repair signals when an address stored in the plurality of defect cell address storage devices corresponds to the external address received by the address buffer. A plurality of redundancy control devices generate a control signal to intercept the word line selecting signal and the bit line selecting signal corresponding to the defect cells in response to the repair signals, and generate another control signal to enable a read/write operation of the redundancy logic cell, in a normal mode, in place of the defect cells.

According to still yet another aspect of the present invention, there is provided a semiconductor memory device. The device includes an address buffer for receiving an external address. A row decoder decodes a row address provided by the address buffer, and generates a word line selecting signal. A column decoder decodes a column address provided by the address buffer, and generates a bit line selecting signal. A memory cell array has a plurality of memory cells. Each of the plurality of memory cells is activated by a selection of a word line and a bit line by the word line selecting signal and the bit line selecting signal, respectively. First redundancy logic cells replace defect cells. Second redundancy logic cells replace the defect cells. A plurality of defect cell address latches store defect cell addresses corresponding to the defect cells. The defect cells are detected in a test mode. A plurality of comparators output repair signals when an address stored in the plurality of defect cell address latches corresponds to the external address received from the address buffer. A redundancy controller generates a control signal to intercept a pass of defect cell address signals of the row decoder and the column decoder in response to the repair signal, generates a first control signal to enable a read/write operation of the first redundancy logic cell when the memory cell array has the defect cells, and generates a second control signal to enable a read/write operation of the second redundancy logic cell when the first redundancy logic cell has the defect cells. The generating of the control signal, the first control signal, and the second control signal occurs in a normal mode.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Reference will now be made in detail to preferred embodiments of the present invention, examples of which being illustrated in the accompanying drawings.

Figure 1:
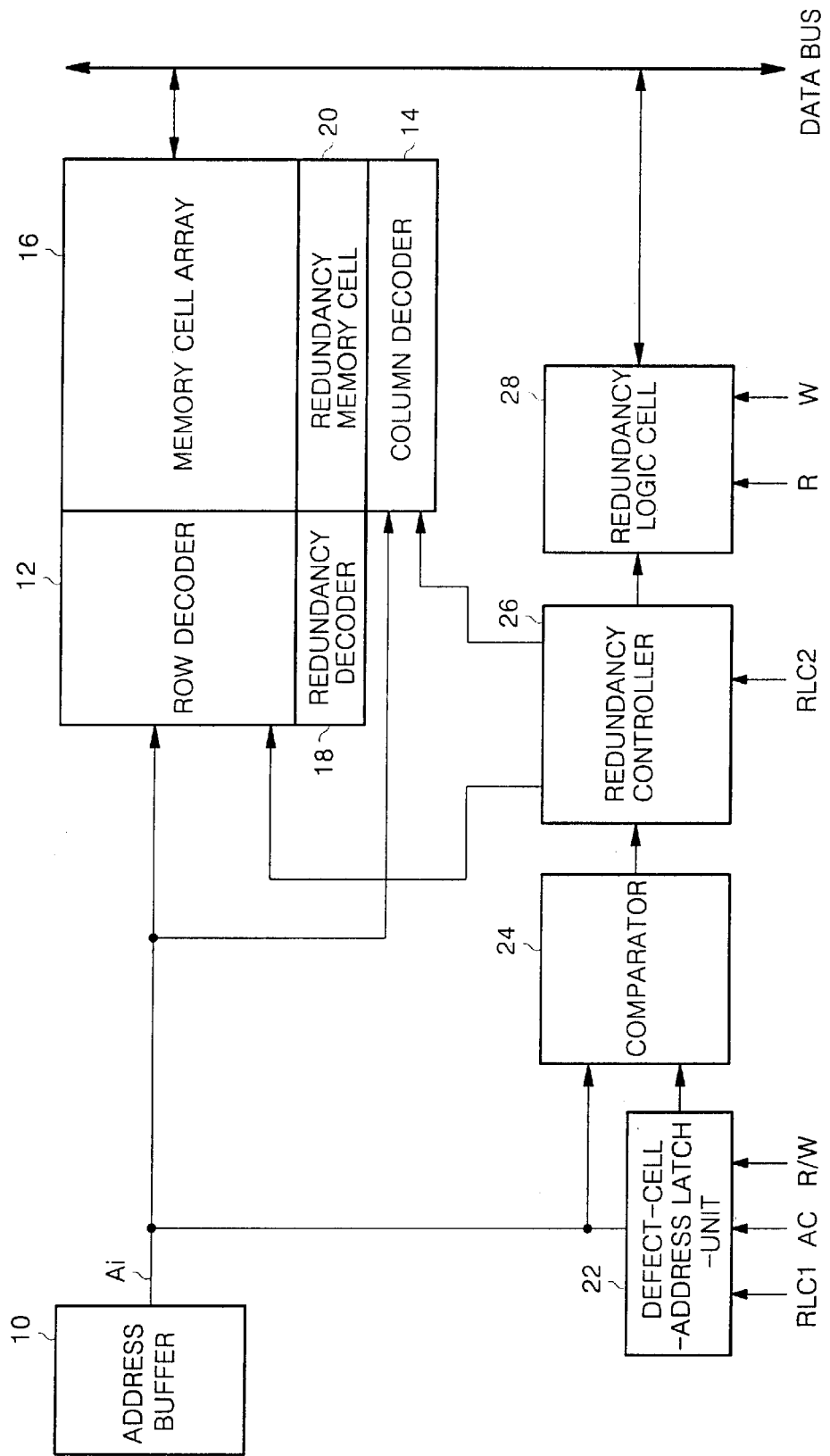
FIG. 1 is a diagram illustrating a semiconductor memory device having redundancy logic cells, according to a preferred embodiment of the present invention.

FIG. 1 is a diagram illustrating a semiconductor memory device having redundancy logic cells, according to a preferred embodiment of the present invention. The semiconductor memory device includes an address buffer 10, a row decoder 12, a column decoder 14, a memory cell array 16, a redundancy decoder 18, a redundancy memory cell 20, a defect-cell-address latch unit 22, a comparator 24, a redundancy controller 26, and a redundancy logic cell 28.

After buffering an external address signal, the address buffer 10 provides a row address for the row decoder 12, and a column address for the column decoder 14. In addition, the output terminal of the address buffer 10 is connected to the defective-cell-address latch unit 22 and the comparator 24.

The row decoder 12 decodes an inputted row address, and then selects a word line corresponding to a memory cell in the memory cell array 16.

The column decoder 14 decodes an inputted column address, and then selects a bit line corresponding to a memory cell in the memory cell array 16.

Therefore, when an input signal selects a word line and a bit line, the input signal, activates a corresponding cell to read data stored in a data bus, or to write data provided from the data bus.

The redundancy memory cell 20 is a spare cell manufactured in the same process with that of the memory cell array 16, and replaces a defect memory cell of the memory cell array 16 when the defect memory cell is found. In other words, a laser beam cuts off fuses of the redundancy decoder 18 in a wafer state so that the redundancy memory cell 20 can repair (i.e., replace) a defective memory cell in the memory cell array 16.

Advantageously, the present invention includes the redundancy logic cell 28, which is disposed in the peripheries of the memory cell array 16 to repair any defect cell in the memory cell array 16 or any defect cell in the redundancy memory cell 20 after packaging.

All of the defective-cell-address latch unit 22, the comparator 24, and the redundancy controller 26 activate the redundancy logic cell 28.

The defective-cell-address latch unit 22 comprises many latches. The defective-cell-address latch unit 22 latches a defect cell address when a package test finds a malfunctioned cell among the memory cell array 16 and among. repaired cells.

The comparator 24 comprises many comparators. The comparator 24 compares a latched address with an address from the outside (i.e., provided externally with respect to the semiconductor memory device), and generates a repair signal when the latched address corresponds to the externally provided address.

In a normal mode, the redundancy controller 26 responds to the repair signal. Therefore, the redundancy controller 26 generates a redundancy control signal RLC2 that intercepts an employment of a normal cell address in the row decoder 12 and the column decoder 14, and generates an enable-signal EN of the redundancy logic cell 28. The enable-signal activates the redundancy logic cell 28 to read data stored in a data-bus by a read-control signal R, or to write data from a data-bus by a write-control signal W.

Figure 2:
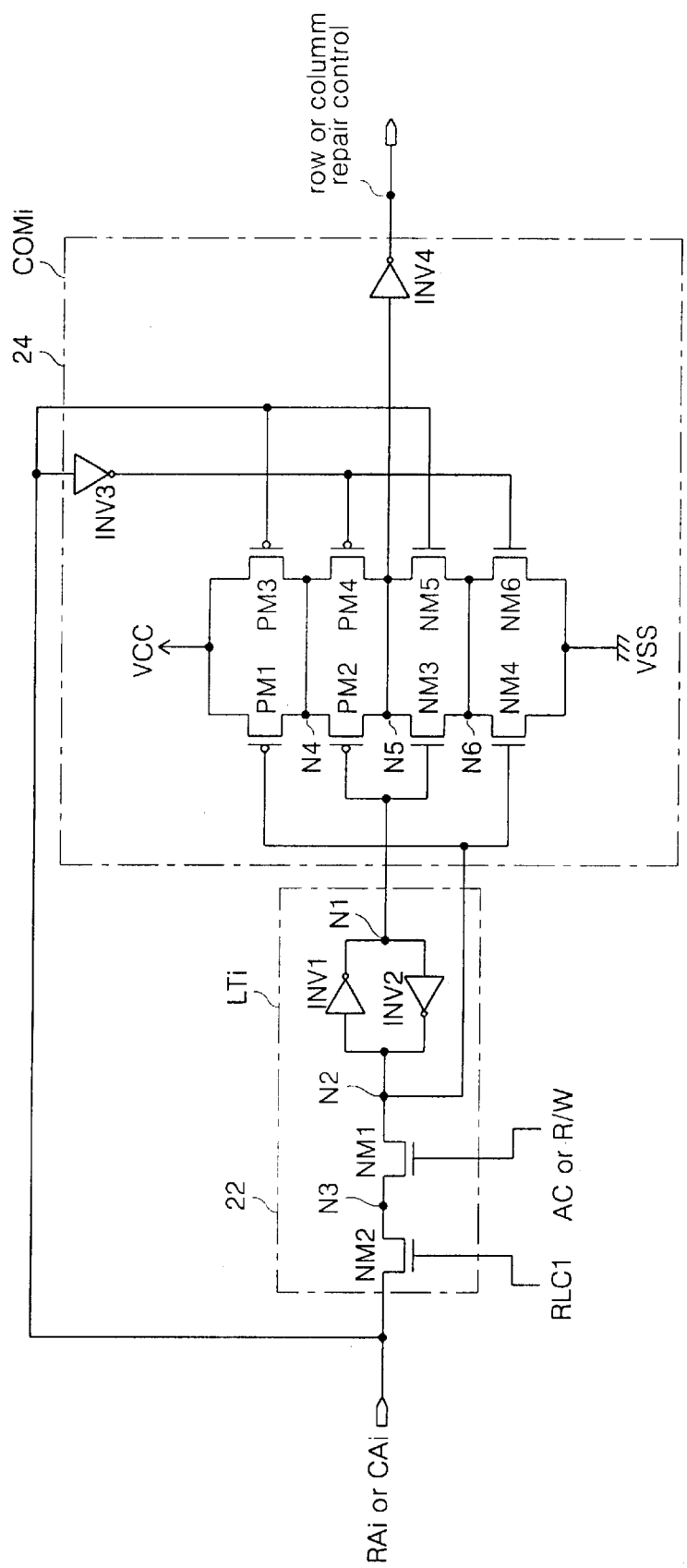
FIG. 2 is a circuit diagram illustrating a defective-cell-address latch unit 22 and a comparator 24 shown in FIG. 1, according to an illustrative embodiment of the present invention.

FIG. 2 is a circuit diagram illustrating a defective-cell-address latch unit 22 and a comparator 24 shown in FIG. 1, according to an illustrative embodiment of the present invention.

Each latch Lti in the defective-cell-address latch unit 22 includes inverters INV1 and INV2, and transistors NM1 and NM2. The output terminal of the inverter INV1 is connected to a node N1 and the input terminal of the inverter INV1 is connected to a node N2. The output terminal of the inverter INV2 is connected to the node N2 and the input terminal of the inverter INV2 is connected to the node N1. An active-signal AC or a read/write-control signal R/W switches the switching. transistor NM1 between the node N2 and a node N3. A redundancy control signal RLC1 switches the switching transistor NM2 placed between the output terminal of the address buffer 10 and the node N3.

Therefore, the latch Lti responds to the active signal AC or the read/write signal R/W, and latches the corresponding address bit-signal in test mode.

Each comparator in the comparator 24 includes four PMOS transistors PM1 to PM4, four NMOS transistors NM3 to NM6, and inverters INV3 and INV4.

The transistor PM1 has a gate, a source, and a drain respectively connected to the node N2, a power voltage VCC, and a node N4. The transistor PM2 has a gate, a source, and a drain respectively connected to the node N1, the node N4, and a node N5. The transistor NM3 has a gate, a source, and a drain respectively connected to the node N1, the node N5, and a node N6. The transistor NM4 has a gate, a source, and a drain respectively connected to the node N2, the node N6, and a ground voltage VSS.

The transistor PM3 has a gate, a source, and a drain respectively connected to the output terminal of the address buffer 10, the power voltage VCC, and the node N4. The transistor PM4 has a gate, a source, and a drain respectively connected to the output terminal of the address buffer 10 through an inverter INV 3, the node N4, and the node N5. The transistor NM5 has a gate, a source, and a drain respectively connected to the output terminal of the address buffer 10, the node N5, and the node N6. The transistor NM6 has a gate, a source, and a drain respectively connected to the output terminal of the address buffer 10 through the inverter INV3, the node N6, and the ground voltage VSS. An input terminal of the inverter INV4 is connected to the node N5. The inverter INV4 converts the signal of the node N5 to the output signal of the comparator 24.

Figure 3:
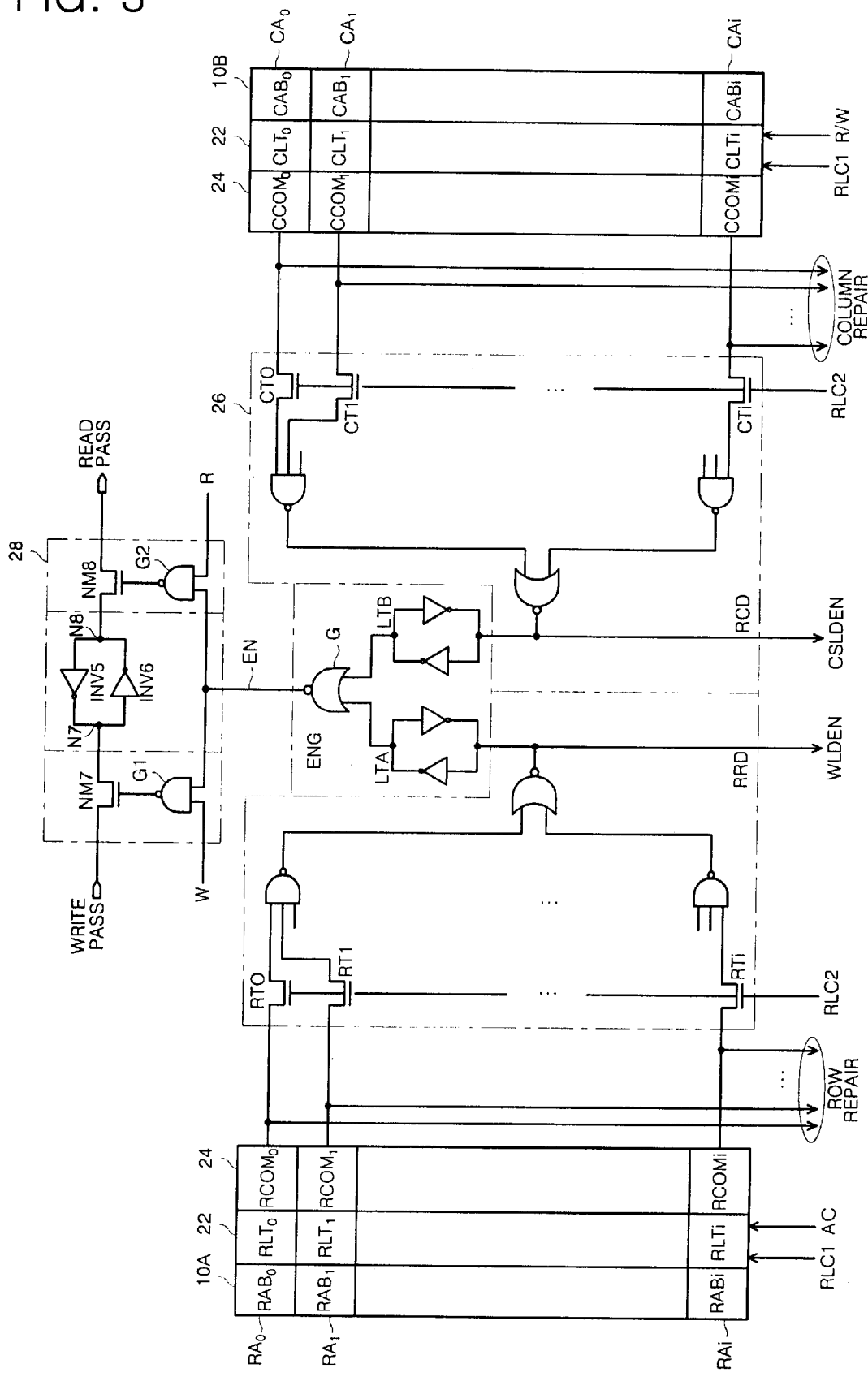
FIG. 3 is a circuit diagram illustrating a redundancy controller 26 and redundancy logic cell 28 shown in FIG. 1, according to a preferred embodiment of the present invention.

FIG. 3 is a circuit diagram illustrating a redundancy controller 26 and redundancy logic cell 28 shown in FIG. 1, according to a preferred embodiment of the present invention. In the preferred embodiment, each address buffer 10 possesses each row address buffer 10A and each column address buffer 10B.

The row address buffer 10A comprises each row address bit buffer RAB0 to RABi. The output of each row address bit buffer is supplied to row defect-cell-address latch unit RLT0 to RLTi, and row comparators RCOM0 to RCOMi. The outputs of the row comparators are supplied to the row decoder 12 as a row repair signal.

The column address buffer 10B comprises each column address bit buffer CAB0 to CABi. The output of each column address bit buffer is supplied to column defect-cell-address latch unit CLT0 to CLTi, and column comparators CCOM0 to CCOMi. The outputs of the column comparators are supplied to the column decoder 14 as a column repair signal.

The redundancy controller 26 includes a redundancy row decoder RRD, a redundancy column decoder RCD, and an enable signal generator ENG.

The redundancy row decoder RRD includes multiple NAND gates, a NOR gate, and multiple input transistors RT0 to RTi for receiving the output of each row comparator. In the normal mode, the redundancy control signal RLC2 is activated to a "high" logic level when the redundancy logic cell 28 is employed, and then the redundancy control signal RLC2 turns on each input transistor RT0 to RTi.

The redundancy row decoder RRD activates a,row interception signal WLDEN to the "low" logic level when the output of every row comparator is at the "low" logic level.

The redundancy column decoder RCD includes multiple NAND gates, a NOR gate, and multiple input transistors CT0 to CTi for receiving the output of each column comparator. In the normal mode, the redundancy control signal RLC2 is activated to the "high" logic level when the redundancy logic cell is employed, and then the redundancy control signal RLC2 turns on each input transistor CT0 to CTi.

The redundancy column decoder RCD activates a column interception signal CSLDEN to the "low" logic level when the output of every column comparator is at the "low" logic level.

The enable signal generator ENG includes a first latch circuit LTA, a second latch circuit LTB, and a logic circuit G. The first latch circuit LTA latches the row interception signal WLDEN. The second latch circuit LTB latches the column interception signal CSLDEN. The logic circuit G combines the data latched in the first latch circuit LTA and the second latch circuit LTB, and then generates an enable-control signal EN of the redundancy logic cell 28.

The redundancy logic cell 28 includes inverters INV5 and INV6, NMOS transistors NM7 and NM8, and NAND gates G1 and G2.

The inverter INV5 has an output terminal connected to a node N7 and an input terminal connected to a node N8. The inverter INV6 has an output terminal connected to the node N8 and an input terminal connected to the node N7. The transistor NM7 is placed between the node N7 and a write pass. The transistor NM8 is placed between the node N8 and a read pass.

The NAND gate G1 combines the enable-control signal EN and the write-control signal W, and then switches the transistor NM7. The NAND gate G2 combines the enable-control signal EN and the read-control signal R, and then switches the transistor NM8.

Therefore, either reading or writing data to the redundancy logic cell 28 is performed in the only case that the enable-control signal EN is activated.

Figure 4:
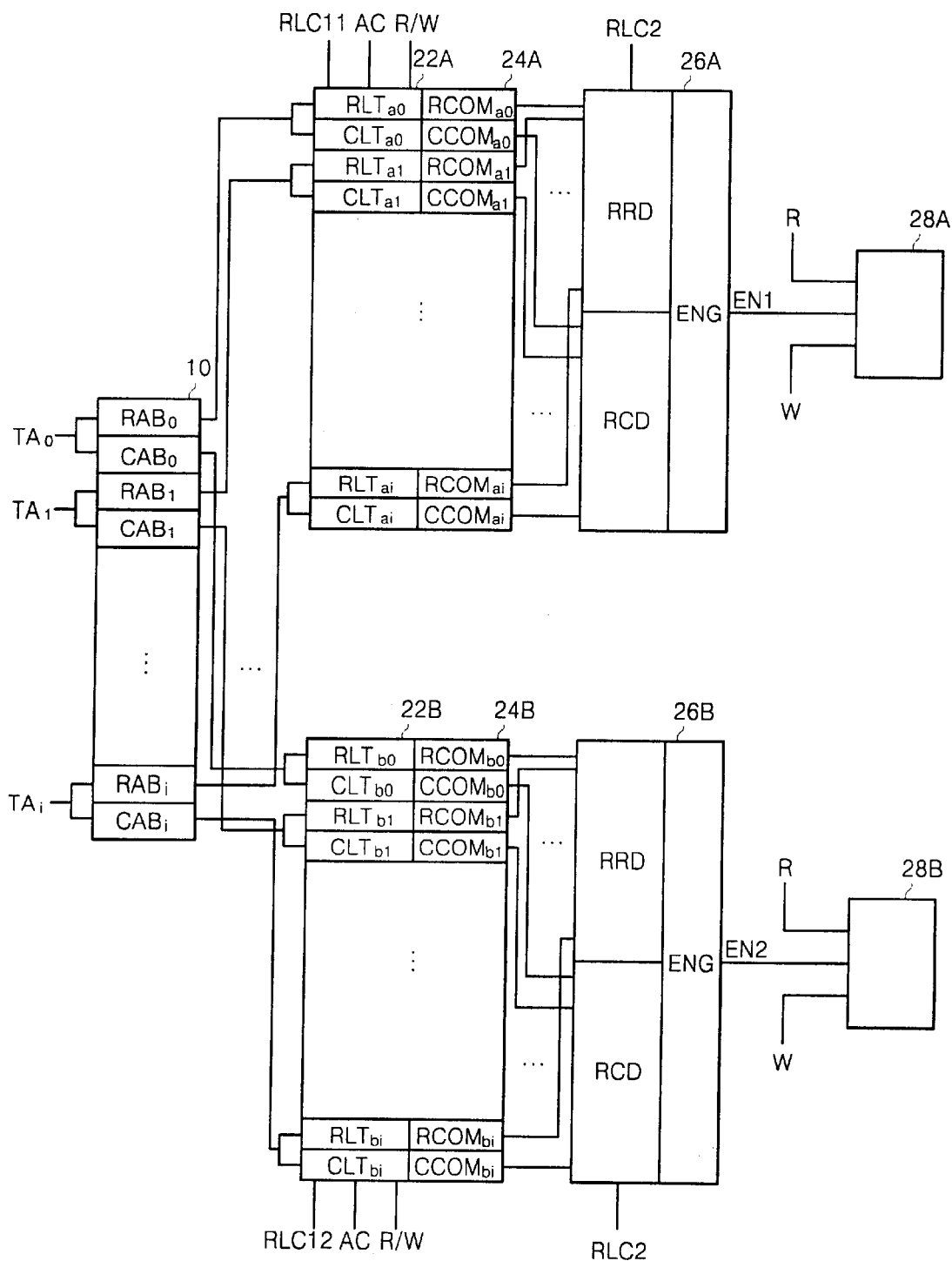
FIG. 4 is a diagram illustrating a semiconductor memory device having redundancy logic cells, according to an alternative preferred embodiment of the present invention.

FIG. 4 is a diagram illustrating a semiconductor memory device having redundancy logic cells, according to an alternative preferred embodiment of the present invention. The alternative preferred embodiment includes redundancy logic cell 28A and 28B. The redundancy logic cell 28A is associated with a defective-cell-address latch unit 22A, a comparator 24A, and a redundancy controller 26A. The redundancy logic cell 28B is associated with a defective-cell-address latch unit 22B, a comparator 24B, and a redundancy controller 26B. In addition, a redundancy control signal RLC11 is applied to the defective-cell-address latch unit 22A. Similarly, a redundancy control signal RLC12 is applied to the defective-cell-address latch unit 22B.

Therefore, the first address signal from the address buffer 10 is latched to the latch unit 22A when the redundancy control signal RLC11 is activated, and the second address signal from the address buffer 10 is latched to the latch unit 22B when the redundancy control signal RLC12 is activated.

The first redundancy logic cell 28A is activated in the case that the first redundancy logic cell 28A receives the first enable-control signal EN1, and the second redundancy logic cell 28B is activated in the case that the second redundancy logic cell 28B receives the second enable-control signal EN2.

Figure 5:
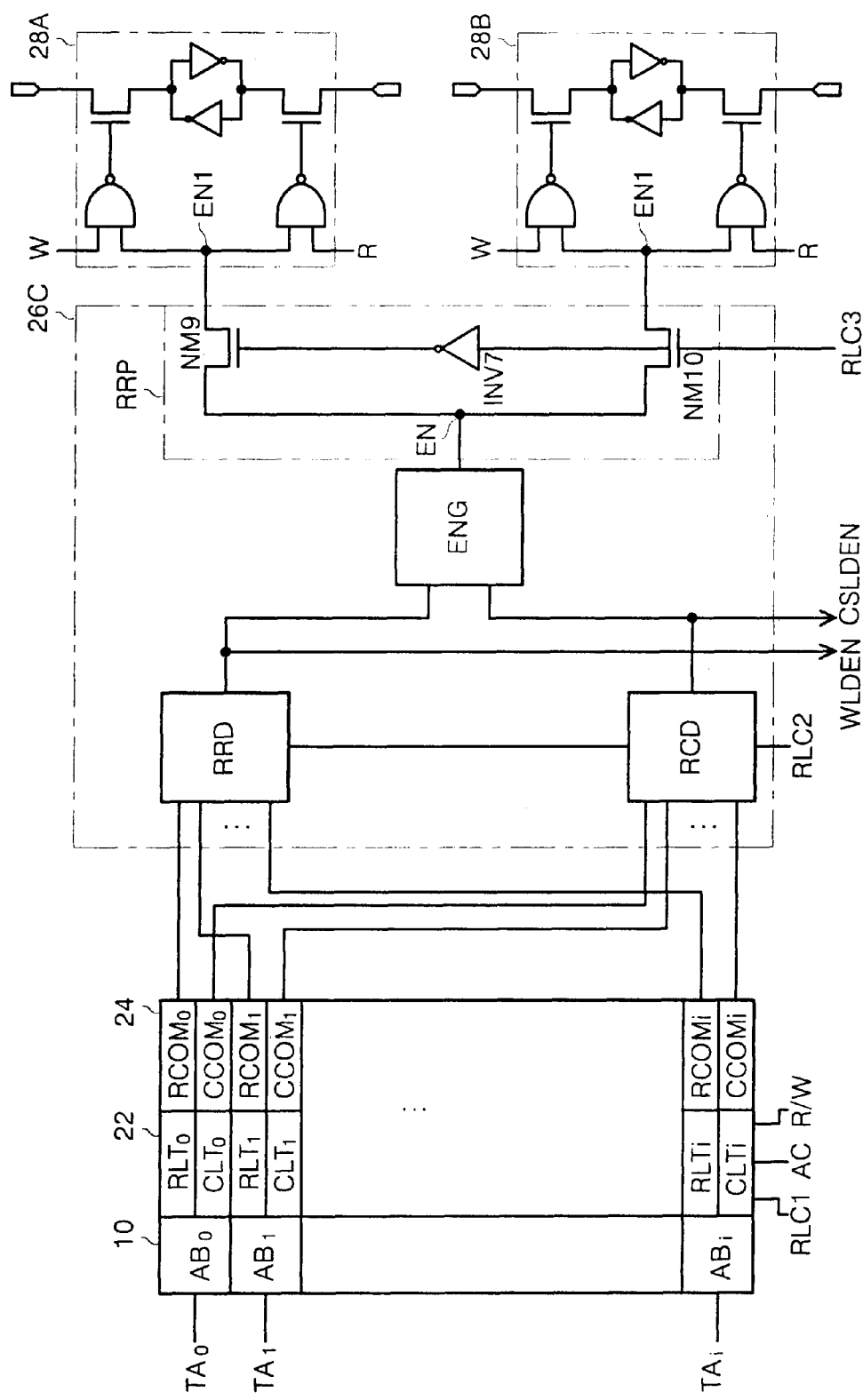
FIG. 5 is a diagram illustrating a semiconductor memory device performing a re-repair process, according to another alternative preferred embodiment of the present invention.

FIG. 5 is a diagram illustrating a semiconductor memory device performing a re-repair process, according to another alternative preferred embodiment of the present invention. The other alternative preferred embodiment includes a pair of redundancy logic cells 28A and 28B. The pair of redundancy logic cell are associated with a defective-cell-address latch unit 22, a comparator 24, and a redundancy controller 26C.

The redundancy controller 26C includes a redundancy row decoder RRD, a redundancy column decoder RCD, an enable signal generator ENG, and a re-repair unit RRP.

The re-repair unit RRP includes transistors NM9 and NM10, and an inverter INV7. The transistor NM9 is connected between an output terminal of the enable-control signal generator ENG and an input terminal of an enable-control signal EN1 in the first redundancy logic cell 28A. The transistor NM10 is connected between the output terminal of the enable-control signal:generator ENG and an input terminal of an enable-control signal EN2 in the second redundancy logic cell 28B. A third redundancy control signal RLC3 is applied to a gate of the transistor NM10, and to a gate of the transistor NM9 through the inverter INV7. In the case that the third redundancy control signal RLC3 is at the "low" logic level, the enable-control signal EN is only applied to the first redundancy logic cell 28A. On the contrary, in the case that the third redundancy control signal RLC3 is at the "high" logic level, the enable-control signal EN is only applied to the second redundancy logic cell 28B.

Therefore, in the case that the first redundancy logic cell 28A is detected as a defect cell in a device test, the third redundancy control signal RLC3 is activated to the "high" logic level so that the second redundancy logic cell 28B can replace the defect cell in the first redundancy logic cell 28A.

Figure 6:
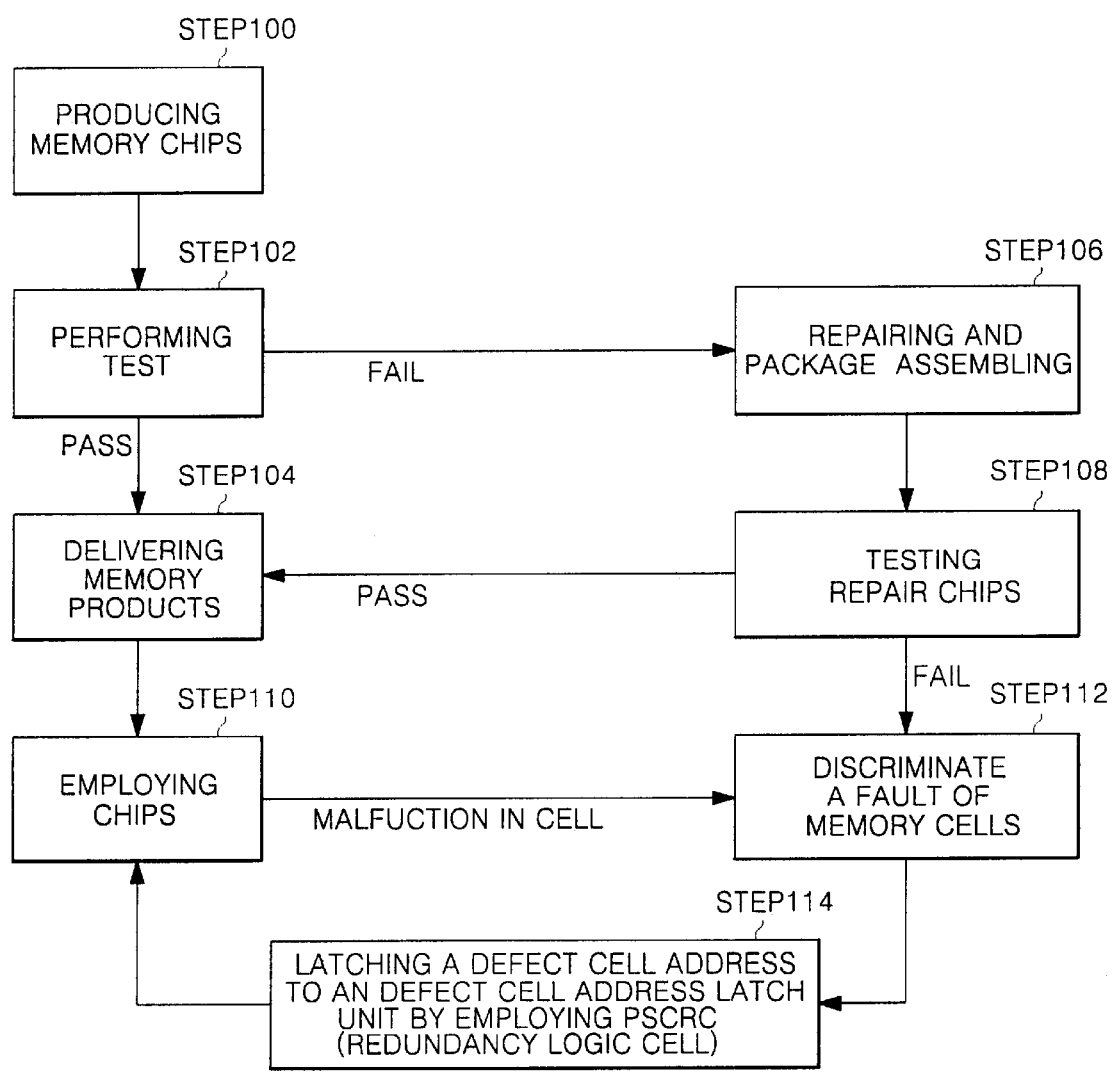
FIG. 6 is a flow chart illustrating a repair process for a semiconductor memory device, according to the preferred embodiment of the present invention.

FIG. 6 is a flow chart illustrating a repair process for a semiconductor memory device, according to the preferred embodiment of the present invention.

Numerous semiconductor memory devices are produced on the wafer (step 100). Tests for semiconductor memory devices are performed at the wafer state (step 102). When any of the memory devices have no defects, these memory devices pass the test performed at step 102 to perform a package process, and then these devices are delivered to customers after the package process (step 104).

At step 102, in the case that testing of the semiconductor memory devices finds any defective devices, then laser repair equipment employs the redundancy memory cell to repair the defect memory device (step 106).

These repaired memory devices are tested again in the package state (step 108). In the case that the test performed at the package state does not detect a defect, these devices are delivered to customers per step 104.

In the case that the package test finds a defective device at step 108, the defective device is reviewed to determine whether or not the defect is due to a malfunction in the memory cells (step 112). In the case of a malfunction in the memory cells (step 110), a redundancy logic cell is employed to repair the defective memory device by latching a defect cell address to a defect-cell-address latch unit (step 114). Repaired semiconductor memory devices employing the redundancy logic cell are treated as normal products.

In the case that a defect cell is found in a semiconductor memory device delivered to a customer, repairing the delivered defective device is also performed through steps 112 and 114. In addition, another alternative preferred embodiment of the present invention illustrates "re-repairing" a malfunctioned redundancy logic cell of a semiconductor memory device.

As described above, the present invention performs a memory test in the package state to detect defective memory cells. The defect cell address is stored to a defective-cell-address latch in the case that the defect cell is found. Then, the defect cell is replaced with a redundancy logic cell in the case that the accessed address from the outside corresponds to the latched address. As a result, the repair of any defective memory cells of a semiconductor memory device may be performed without constraint. In addition, the redundancy logic cell established in the peripheries of a memory cell array has different physical structures from the memory cell array, which drastically decreases the probability of defects in the redundancy logic cell as compared with a semiconductor memory device having a conventional redundancy cell.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:
   an address buffer for receiving an external address;
   a row decoder for decoding a row address provided by the address buffer, and generating a word line selecting signal;
   a column decoder for decoding a column address provided by the address buffer, and generating a bit line selecting signal;
   a memory cell array having a plurality of memory cells, each of the plurality of memory cells being activated by a selection of a word line and a bit line by the word line selecting signal and the bit line selecting signal, respectively;
   a redundancy logic cell for replacing defect cells in the memory cell array;
   a plurality of defect cell address latches for storing defect cell addresses corresponding to the defect cells in the memory cell array, the defect cells being detected in a memory test;
   a plurality of comparators for outputting repair signals when an address stored in the plurality of defect cell address latches corresponds to the external address received by the address buffer; and
   a redundancy controller for generating a control signal to intercept the word line selecting signal and the bit line selecting signal corresponding to the defect cells in response to a repair signal outputted in a normal mode, and generating another control signal to enable a read/write operation of the redundancy logic cell in place of the defect cells.

2. The semiconductor memory device according to claim 1, wherein the redundancy logic cell is established in a periphery of the memory cell array.

3. The semiconductor memory device according to claim 1, wherein the redundancy logic cell comprises:
- a first inverter, having an output terminal and an input terminal respectively connected to a first node and a second node;
- a second inverter, having an input terminal and an output terminal respectively connected to the first node and the second node;
- a first switching transistor placed between the first node and a write pass;
- a second switching transistor placed between the second node and a read pass;
- a first logic circuit for combining an enable-control signal and a write control signal provided from the redundancy controller, and switching the first switching transistor; and
- a second logic for combining an enable-control signal and a read control signal provided from the redundancy controller circuit, and switching the second switching transistor.

4. The semiconductor memory device according to claim 1, wherein each of the plurality of defect cell address latches comprises:
- a first inverter, having an output terminal and an input terminal respectively connected to a first node and a second node;
- a second inverter, having an input terminal and an output terminal respectively connected to the first node and the second node;
- a first switching transistor placed between the second node and a third node, for switching by an active signal or a read/write control signal; and
- a second switching transistor placed between the third node and an output terminal of the address buffer, for switching in response to a redundancy control signal.

5. The semiconductor memory device according to claim 1, wherein each of the plurality of comparators comprises:
- a first transistor, having a gate, a source, and a drain respectively connected to a second node, a power voltage, and a fourth node;
- a second transistor, having a gate, a source, and a drain respectively connected to a first node, the fourth node, and a fifth node;
- a third transistor, having a gate, a source, and a drain respectively connected to the first node, the fifth node, and a sixth node;
- a fourth transistor, having a gate, a source, and a drain respectively connected to the second node, the sixth node, and a ground voltage;
- a fifth transistor, having a gate, a source, and a drain respectively connected to the output of the address buffer, the power voltage, and the fourth node;
- a sixth transistor, having a gate, a source, and a drain respectively connected to the output of the address buffer through a third inverter, the fourth node, and the fifth node;
- a seventh transistor, having a gate, a source, and a drain respectively connected to the output of the address buffer, the fifth node, and the sixth node;
- an eighth transistor, having a gate, a source, and a drain respectively connected to the output of the address buffer through the third inverter, the sixth node, and the ground voltage; and
- a fourth inverter for converting a fifth node signal from the fifth node to a comparator output signal.

6. The semiconductor memory device according to claim 1, wherein the redundancy controller comprises:
- a plurality of input-switching transistors for receiving a redundancy control signal and switching each output of the plurality of comparators individually;
- a redundancy row decoder for decoding outputs of the plurality of comparators that correspond to row addresses and generating a row interception signal to cut off a pass to a row address of a defect cell, the outputs of the plurality of comparators that correspond to the row addresses being input through the input switching transistors;
- a redundancy column decoder for decoding outputs of the plurality of comparators that correspond to column addresses and generating a column interception signal to cut off a pass to a column address of the defect cell, the outputs of the plurality of comparators that correspond to the column addresses being input through the input switching transistors;
- a first latch circuit for latching the row interception signal;
- a second latch circuit for latching the column interception signal; and
- a logic circuit for combining an output of the first latch circuit and an output of the second latch circuit, and generating an enable-control signal of the redundancy logic cell.

7. A method for repairing defective memory cells of a semiconductor memory device in a package state, the device having a memory cell array, the method comprising the steps of:
- performing a memory test on the semiconductor memory device in the package state to identify defect cell addresses corresponding to the defective memory cells;
- latching the defect cell addresses when the defect cells are found in the memory cell array during the memory test;
- comparing an inputted address with a latched address in a normal operating mode; and
- disabling a pass to the inputted address and enabling a redundancy logic cell in place of a defective memory cell in the memory cell array, when the inputted address corresponds to the latched address.

8. The method according to claim 7, wherein the semiconductor memory device further has a redundancy memory cell, the performing step comprises the step of identifying a defect cell address corresponding to the redundancy memory cell, the latching step comprises the step of latching the defect cell address corresponding to the redundancy memory cell, the comparing step comprises the step of comparing the inputted address with the latched defect cell address corresponding to the redundancy memory cell, and the disabling step comprises the step of disabling the pass to the inputted address and enabling the redundancy logic cell in place of the redundancy memory cell, when the inputted address corresponds to the latched defect cell address corresponding to the redundancy memory cell.

9. A semiconductor memory device, comprising:
- a row address buffer for receiving an external row address signal;
- a column address buffer for receiving an external column address signal;
- a row decoder for decoding a row address provided by the row address buffer, and generating a word line selecting signal;
- a column decoder for decoding a column address provided by the column address buffer, and generating a bit line selecting signal;

a memory cell array having a plurality of memory cells, each of the plurality of memory cells being activated by a selection of a word line and a bit line by the word line selecting signal and the bit line selecting signal respectively;

a redundancy logic cell for replacing defect cells in the memory cell array;

a plurality of defect cell row address latches for storing defect cell row addresses corresponding to the defect cells in the memory cell array, the defect cells being detected in a memory test;

a plurality of defect cell column address latches for storing defect cell column addresses corresponding to the defect cells in the memory cell array, the defect cells being detected in the memory test;

a plurality of first comparators for outputting row repair signals when a defect cell row address stored in one of the plurality of defect cell row address latches corresponds to the row address provided by the row address buffer in a normal mode;

a plurality of second comparators for outputting column repair signals when a defect cell column address stored in one of the plurality of defect cell column address latches corresponds to the column address provided by the column address buffer:in the normal mode; and a redundancy controller for generating a control signal to intercept the word line selecting signal and the bit line selecting signal corresponding to the defect cells in response to a row and a column repair signal, and generating another control signal to enable a read/write operation of the redundancy logic cell in place of the defect cells.

10. The semiconductor memory device according to claim 9, wherein the redundancy logic cell is established in a periphery of the memory cell array.

11. The semiconductor memory device according to claim 9, wherein the redundancy logic cell comprises:

a first inverter, having an output terminal and an input terminal respectively connected to a first node and a second node;

a second inverter, having an input terminal and an output terminal respectively connected to the first node and the second node;

a first switching transistor placed between the first node and a write pass;

a second switching transistor placed between the second node and a read pass;

a first logic circuit for combining an enable-control signal and a write control signal provided from the redundancy controller, and switching the first switching transistor; and a second logic for combining an enable-control signal and a read control signal provided from the redundancy controller circuit, and switching the second switching transistor.

12. A semiconductor memory device, comprising:

an address buffer for receiving an external address;

a row decoder for decoding a row address provided by the address buffer, and generating a word line selecting signal;

a column decoder for decoding a column address provided by the address buffer, and generating a bit line selecting signal;

a memory cell array having a plurality of memory cells, each of the plurality of memory cells being activated by a selection of a word line and a bit line by the word line selecting signal and the bit line selecting signal respectively;

a redundancy logic cell for replacing defect cells in the memory cell array;

a plurality of defect cell address storage devices for storing defect cell addresses corresponding to the defect cells in the memory cell array, the defect cells being detected in a test mode;

a plurality of comparison devices for outputting repair signals when an address stored in the plurality of defect cell address storage devices corresponds to the external address received by the address buffer; and a plurality of redundancy control devices for generating a control signal to intercept the word line selecting signal and the bit line selecting signal corresponding to the defect cells in response to the repair signals, and generating another control signal to enable a read/write operation of the redundancy logic cell, in a normal mode, in place of the defect cells.

13. The semiconductor memory device according to claim 12, wherein the redundancy logic cell is established in a periphery of the memory cell array.

14. The semiconductor memory device according to claim 12, wherein the redundancy logic cell comprises:

a first inverter, having an output terminal and an input terminal respectively connected to a first node and a second node;

a second inverter, having an input terminal and an output terminal respectively connected to the first node and the second node;

a first switching transistor placed between the first node and a write pass;

a second switching transistor placed between the second node and a read pass;

a first logic circuit for combining an enable-control signal and a write control signal provided from the redundancy controller, and switching the first switching transistor; and a second logic for combining an enable-control signal and a read control signal provided from the redundancy controller circuit, and switching the second switching transistor.

15. A semiconductor memory device, comprising:

an address buffer for receiving an external address;

a row decoder for decoding a row address provided by the address buffer, and generating a word line selecting signal;

a column decoder for decoding a column address provided by the address buffer, and generating a bit line selecting signal;

a memory cell array having a plurality of memory cells, each of the plurality of memory cells being activated by a selection of a word line and a bit line by the word line selecting signal and the bit line selecting signal, respectively;

first redundancy logic cells for replacing defect cells;

second redundancy logic cells for replacing the defect cells;

a plurality of defect cell address latches for storing defect cell addresses corresponding to the defect cells, the defect cells being detected in a test mode;

a plurality of comparators for outputting repair signals when an address stored in the plurality of defect cell address latches corresponds to the external address received from the address buffer; and a redundancy controller for generating a control signal to intercept a pass of defect cell address signals of the row decoder and the column decoder in response to the repair signal, generating a first control signal to enable a read/write operation of the first redundancy logic cell when the memory cell array has the defect cells, and generating a second control signal to enable a read/write operation of the second redundancy logic cell when the first redundancy logic cell has the defect cells, the generating of the control signal, the first control signal, and the second control signal occurring in a normal mode.

16. The semiconductor memory device according to claim 15, wherein the second redundancy logic cell is established in a periphery of the memory cell array.

17. The semiconductor memory device according to claim 16, wherein the first redundancy logic cell is established proximate to the memory cell array.

18. A semiconductor memory device, comprising:

an address buffer for receiving an external address;

a row decoder for decoding a row address provided by the address buffer, and generating a word line selecting signal;

a column decoder for decoding a column address provided by the address buffer, and generating a bit line selecting signal;

a memory cell array having a plurality of memory cells, each of the plurality of memory cells being activated by a selection of a word line and a bit line by the word line selecting signal and the bit line selecting signal, respectively;

a redundancy memory cell, disposed proximate to the memory cell array, for replacing defect cells in the memory cell array;

a redundancy logic cell, disposed along a periphery of the memory cell array, for replacing defect cells in the memory cell array and the redundancy memory cell;

a plurality of defect cell address latches for storing defect cell addresses corresponding to the defect cells in the memory cell array, the defect cells being detected in a memory test;

a plurality of comparators for outputting repair signals when an address stored in the plurality of defect cell address latches corresponds to the external address received by the address buffer; and a redundancy controller for generating a control signal to intercept the word line selecting signal and the bit line selecting signal corresponding to the defect cells in response to a repair signal outputted in a normal mode, and generating another control signal to enable a read/write operation of the redundancy logic cell in place of the defect cells.

* * * * *